United States Patent [19]

Myer et al.

[11] Patent Number: 5,300,894
[45] Date of Patent: Apr. 5, 1994

[54] CIRCUITRY FOR MINIMIZING PEAK POWER IN AN AMPLIFIER CARRYING A PLURALITY OF SIGNALS OF DIFFERING FREQUENCIES

[75] Inventors: Robert E. Myer, Denville; Clifford W. Schaible, Morristown, both of N.J.

[73] Assignee: AT&T Bell Laboratories, Murray Hill, N.J.

[21] Appl. No.: 963,784

[22] Filed: Oct. 20, 1992

[51] Int. Cl.⁵ .............................................. H03G 3/20
[52] U.S. Cl. .................................. 330/129; 330/124 R; 330/279; 330/295; 455/103; 455/126
[58] Field of Search ................. 330/129, 124 R, 279, 330/295; 455/103, 126

[56] References Cited

U.S. PATENT DOCUMENTS

| | | | |
|---|---|---|---|
| 4,010,426 | 3/1977 | Rambo | 330/53 |
| 4,064,464 | 12/1977 | Morse | 330/124 R X |
| 4,370,622 | 1/1983 | Hornbeck et al. | 330/207 P |
| 4,546,313 | 10/1985 | Moyer | 324/107 P |
| 5,043,673 | 8/1991 | Suematsu et al. | 330/149 |
| 5,101,172 | 3/1992 | Ikeda et al. | 330/136 |
| 5,101,211 | 3/1992 | DuFort | 330/295 X |

FOREIGN PATENT DOCUMENTS 0466123 9/1991 Japan .

Primary Examiner—James B. Mullins
Attorney, Agent, or Firm—Alfred G. Steinmetz

[57] ABSTRACT

In plural channel amplifier systems processing many phase locked signals of different frequencies as a combined signal, these signals may drift into a phase convergence causing a peak power occurrence in the amplifier which greatly exceeds the rated capacity of the amplifier system. Therefore, in accord with the invention, a dynamic adjustment system is provided to minimize the peak power to which the amplifier is subjected by adjusting the relative phase relationships of the many signals. The dynamic adjustment system includes a peak power detector, a hard wired logic decision circuit and a timing control to control phase shift adjustment steps.

10 Claims, 4 Drawing Sheets

CIRCUITRY FOR MINIMIZING PEAK POWER IN AN AMPLIFIER CARRYING A PLURALITY OF SIGNALS OF DIFFERING FREQUENCIES

FIELD OF THE INVENTION

This invention relates to multi-channel signal amplification systems in a communication system and to apparatus for increasing the handling capacity of such a signal amplifier relative to its power rating. It is also concerned with preventing variations of the phases of individual carrier signals comprising the multiple channel signal from causing occurrences of very high envelope signal peaks in the multi-channel signal.

BACKGROUND OF THE INVENTION

Wireless telecommunications systems are divided into a series of cell areas covering a service area. Each cell area has a transmitting base station using its own operating frequency set comprising a plurality of radio channels to communicate with mobile subscribers. Each channel represents an information signal at a particular frequency carrier or band.

It has been found advantageous to combine these channels for transmission purposes. The channels are all combined by a broadband signal combiner into a multi-channel signal at low power levels and then amplified by a single linear amplifier (or its equivalent a plurality of linear amplifiers in parallel, each amplifying a reduced power version of the same multi-channel signal) to raise the multi-channel signals to an appropriate transmit power level.

The various radio channels are distributed in frequency with respect to each other in that each operates within a different frequency band. Simultaneous occurrence of individual signal peaks readily occur and hence the multi-channel signal is subject to power maximums where the peak power significantly exceeds the average power of the envelope due to constructive addition of the individual signal peaks.

A straight forward response to this problem has been to select the power rating of the linear amplifier to accommodate the theoretical maximum peak power level of the composite multi-channel signal. However, this significantly increases the cost of the linear amplifier since its power rating must be increased in proportion to the square of the number of signals processed. This high power rating is also only needed for a small fraction of the operating time of the amplifier (that is, during the high peaks of the combined multi-channel signal). It is desirable to operate the system with amplifiers of power handling ratings based on the average power of the sum of the carriers than to require that an amplifier be rated to handle the extreme high peak power caused by the constructive addition of the individual carriers.

SUMMARY OF THE INVENTION

In plural channel amplifier systems processing many phase locked signals of different frequencies as a combined signal, these signals may drift into a phase convergence causing a peak power occurrence in the amplifier which greatly exceeds the rated capacity of the amplifier system. Therefore, in accord with the invention, a dynamic adjustment system is provided to minimize the peak power to which the amplifier is subjected by adjusting the relative phase relationships of the many signals. The dynamic adjustment system includes a peak power detector, a hard wired logic decision circuit and a timing control to control phase shift adjustment steps.

DETAILED DESCRIPTION

Figure 1:
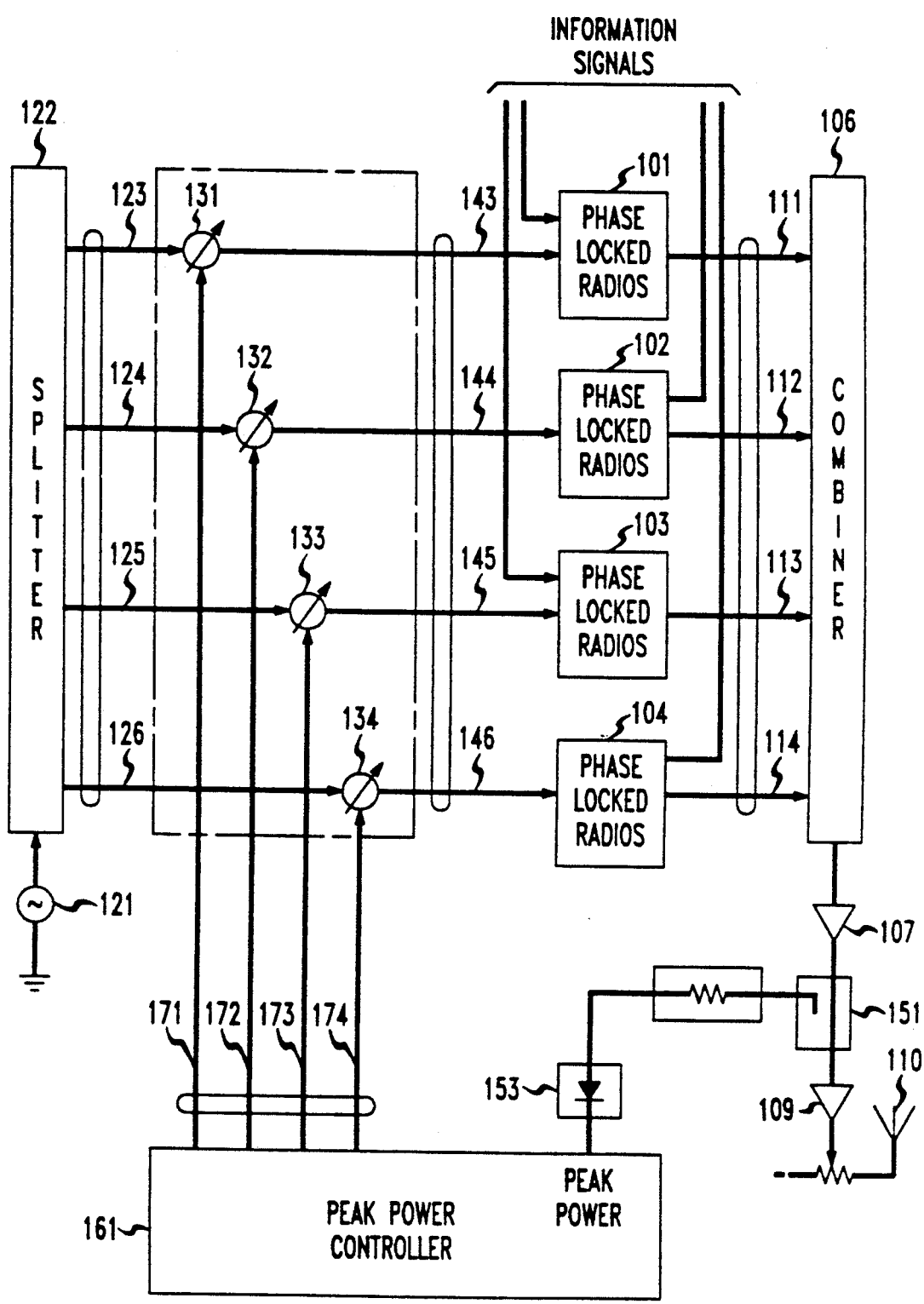
FIG. 1 is a block schematic of an amplifier system control arrangement to limit the peak power of an amplifier system.

An exemplary system for reducing peak power in an amplifier system processing a plurality of different signal channels spaced apart in frequency from one another; each channel having a different carrier frequencies is shown in the FIG. 1. The apparatus shown is included in a cellular base station in which the phase locked radios handle different channels in the channel set assigned to the cell served by the cellular base station.

A plurality of phase locked radios, 101, 102, 103 and 104, are connected to receive audio and data designated as information signals. These signals are FM modulated and transmitted as FM signals at different carrier frequencies for each of the phase locked transceivers. The FM signals (radio frequency output signals) are individually transmitted, via leads 111, 112, 113 and 114, to a combiner circuit 106 that superimposes all the modulated carrier signals into a composite modulated signal including all the information supplied to the radios 101-104. This composite signal is applied to the preamplifier 107 and subsequently to a linear amplifier 109 which amplifies the composite signal to a radio transmission level. The linear amplifier output is connected to an antenna 110 for transmission to the cell area.

The frequencies of the carrier signals in each of the radios are synchronized to a reference frequency supplied from a reference signal derived from a reference frequency generator 121. The output of the reference frequency generator 121 is applied to a signal splitter apparatus 122 which applies the reference frequency signal onto the four leads 123, 124, 125 and 126. These four leads are coupled to the voltage controlled phase shifters 131, 132, 133 and 134, whose operation is discussed subsequently. The output of the phase shifters is connected via leads 143, 144, 145 and 146 to reference signal inputs of the phase locked radios 101-104.

In this illustrative arrangement the carriers of the transceivers are equally spaced apart in frequency. Each radio is locked to the same reference frequency supplied to the leads 123-146. Due to thermal effects in the phase locked loops, the carriers drift with respect to each other and as shown the peaks of several carriers may coincide in time producing a high peak power in the linear amplifier 109.

The power input to the linear amplifier 109 is sensed by the coupling device 151 which is connected to a peak power detector 153. The values for peak power are applied to a digital circuit controller 161. The Controller, shown in the FIG. 2, continuously monitors the peak power of the signal processed by the linear amplifier 109. Controller 161 includes digital circuitry to evaluate and respond to this peak power and apply control voltages, via leads 171, 172, 173 and 174, to the voltage controlled phase shifters 131-134.

In the arrangement of FIG. 1, a 1 to 3 degree phase shift of the reference frequency inputs corresponds to a 60 to 180 degree phase shift at the RF outputs since the reference frequency divide ratio is nominally equal to 60. The phase shift for each individual carrier is applied to the corresponding reference signal input to which the radio carrier is synchronized. In the illustrative embodiment this reference frequency is in the MHz range.

Figure 2:
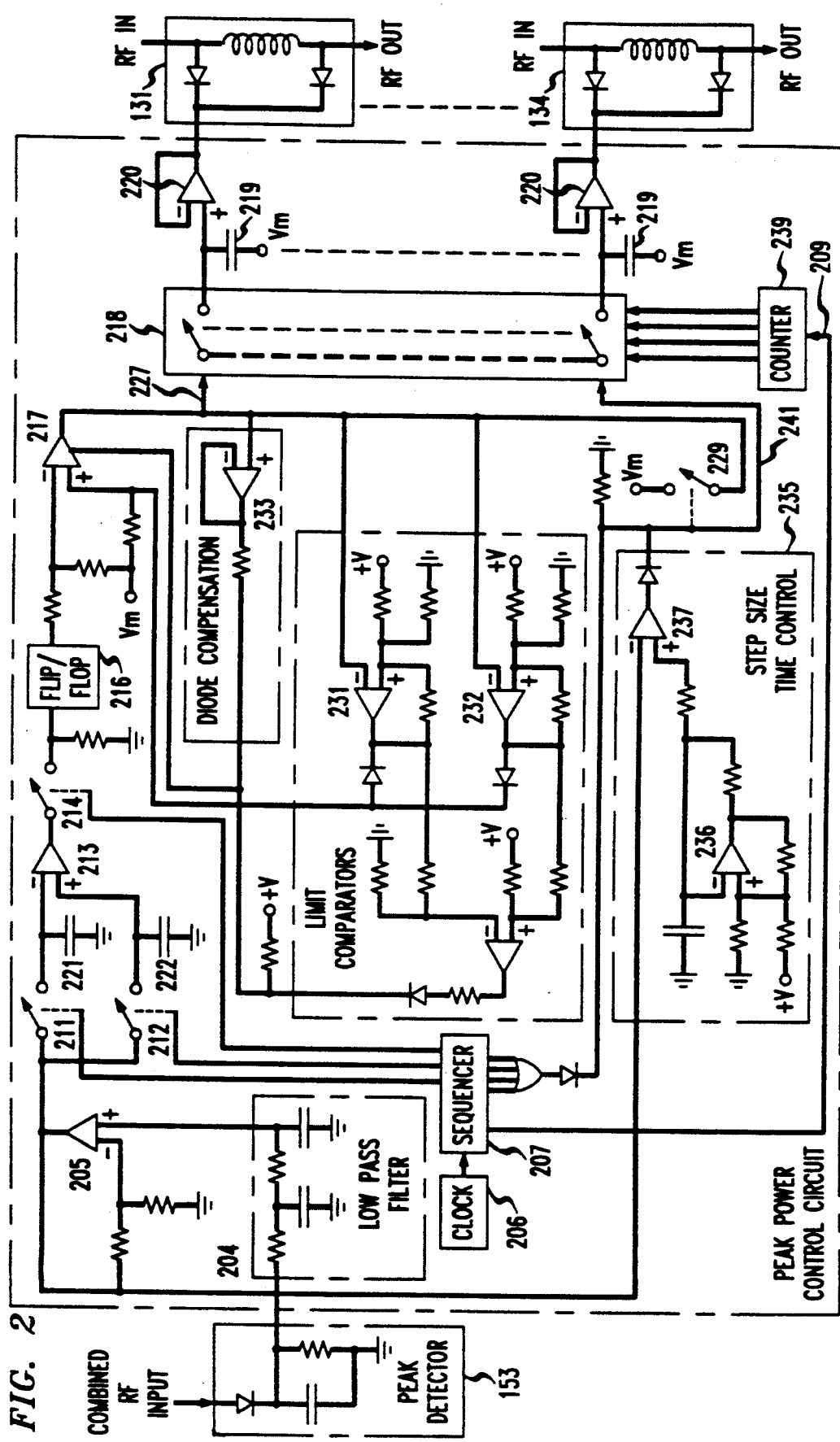
FIG. 2 is a block schematic of a digital circuit controller used in the amplifier control systems of FIG. 1.

The digital circuitry of the controller is shown in block schematic form in the FIG. 2. It measures the peak power applied to the linear amplifier and compares it with limits. If the limit exceeds a desirable value, it applies phase shifting signals to at least one phase shifter controlling the phase of a signal passing through a radio unit.

The signal input of a linear amplifier is applied by a directional coupler to a peak power detector circuit 153. Such a circuit may comprise as shown a diode coupling the output of the directional coupler to a storage capacitor shunted by a discharge resistor. The output of the control circuit is applied to varactor diode phase shifters 131-134 each of which include two varactor diode connected to opposite terminals of an inductor connected in the path of the reference signal or channel signal of the various radio units. Each phase shifter is adjusted sequentially in response to the power measured by the peak power detector. A decision circuit monitors the direction of detector output and controls the phase adjustments to minimize peak power.

The output of the peak detector circuit 153 is applied, through a low pass filter 204 and amplifier 205, to a sampling circuit comprising switches 211 and 212 and the storage capacitors 221 and 222. The switches 211 and 212 are controlled by a sequencer 207 which is synchronized by a clock 206. The first switch 211 applies a first charge from the peak detector 153 to the capacitor 221. This charge is used, as a reference level. Then a phase adjustment is made by adjusting a bias of one of the phase shifters 131-134. A second subsequent output of the peak detector 153 is applied by subsequently operated switch 212 to the capacitor 222. The voltages of capacitors 221 and 222 are applied to the inputs of a comparator 213. The response of the comparator 213 is to produce a logic one output as peak power goes up and a logic zero output if peak power decreases. The comparator output is connected by a switch 214 to a toggle flip flop 216. If a logic one output of the comparator is present after the second peak power sample is taken, the flip flop 216 is toggled causing the reversal of the current source amplifier 217. This reversal of the current source amplifier causes the next phase adjustment to occur in the opposite direction to the previous adjustment.

The output of the current source amplifier 217 is coupled through a channel multiplexer 218 to a plurality of capacitors 219, each being associated with one of the phase adjusters. The capacitors 219 are connected to the phase adjusters 131-134, via buffer amplifiers 220, to limit the rate of discharge. These capacitors 219 supply the control voltages for each of the varactor phase adjusters 131-134. The output lead 227, of the current source amplifier 217, is also connected to a switch 229 and to the high and low limit comparators 231 and 232. When either limit is reached the control capacitor for a varactor diode is adjusted to its midrange value.

The control signals for the switches 211, 212, and 214 are supplied by the sequencer 207. A timing diagram of the sequencer output is discussed below with reference to the FIG. 3. The sequencer 207 is clocked by the clock source whose timing marks 312 are shown in the waveform 311 in FIG. 3.

The current source amplifier 217 is connected in sequence to the capacitors 219 in response to the counter 239 (keyed to the sampling rate by lead 209) which steps the through connections provided by the multiplexer 218. Since the varactors are essentially non-linear, the non-linear characteristic is compensated by controlling the current output of the current source amplifier as a function of the voltage on the varactor diode. Diode compensation is provided by the amplifier 233. A step size control circuit 235, including amplifiers 236 and 237, controls the size of adjustment steps to the capacitors 219 as a function of reductions in peak power. It operates by controlling the time that the current source amplifier delivers current. The amplifier 236 generates a triangular wave output and the amplifier 237 operates as a comparator. As the peak power level changes with respect to the triangular wave voltage amplifier 237 produces a pulse output which switches the current source amplifier on and off to control the average current output charging the capacitors 219. If the peak power level is high the current source is on most of the time. If the peak power level is relatively low the output current is low and only small adjustments are made to the capacitor voltage levels of capacitors 219.

Figure 3:
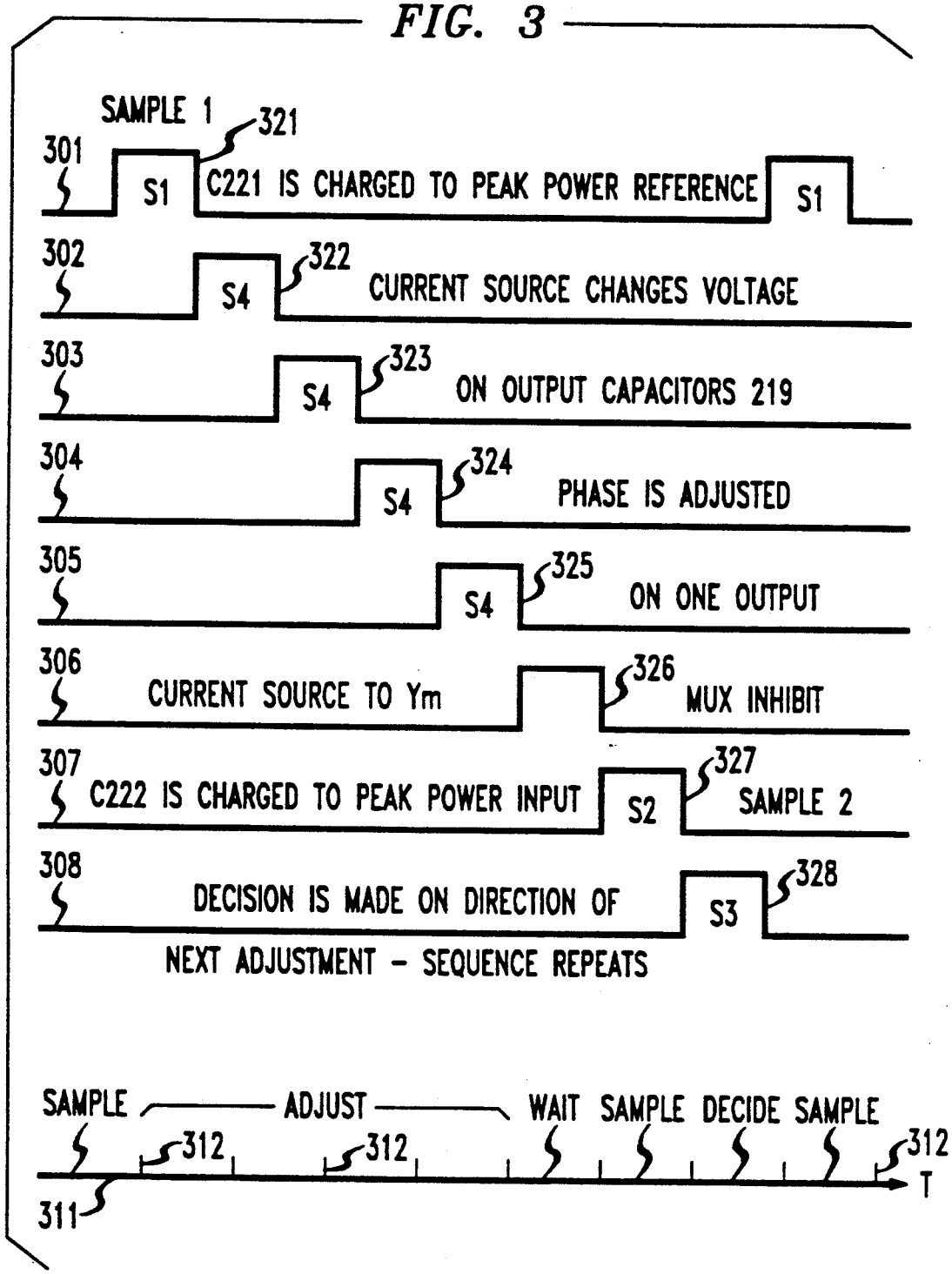
FIG. 3 discloses waveforms showing the timing sequence of operations provided by the controller of FIG. 2.

The operation of the control circuit may be ascertained by examination of the timing waveforms of FIG. 3. The pulses of these waveforms are generated by the sequencer 207. Sequencers are well known in the art and it is not believed necessary to describe its circuitry herein. The Pulse 321 of waveform 301 closes switch 211 for the duration of the pulse. Pulses 322-325 of waveforms 302-305 subsequently open switch 229 for a period of adjustment whose time interval is determined by the condition of the step size control 235. During pulses 326, 327, 328 and 321 the throughput of the multiplexer 218 is inhibited and switch 229 is closed by a positive voltage on lead 241. Pulse 327 of waveform 307 closes switch 212 for the duration of the pulse to provide a sample of the peak power to the comparator 214. During pulse 328 of waveform 308 the output of comparator 213 is coupled by the switch 214 to flip flop 216. The sequence is repeated by the application of the pulse 321 of waveform 301 to close switch 211.

Figure 4:
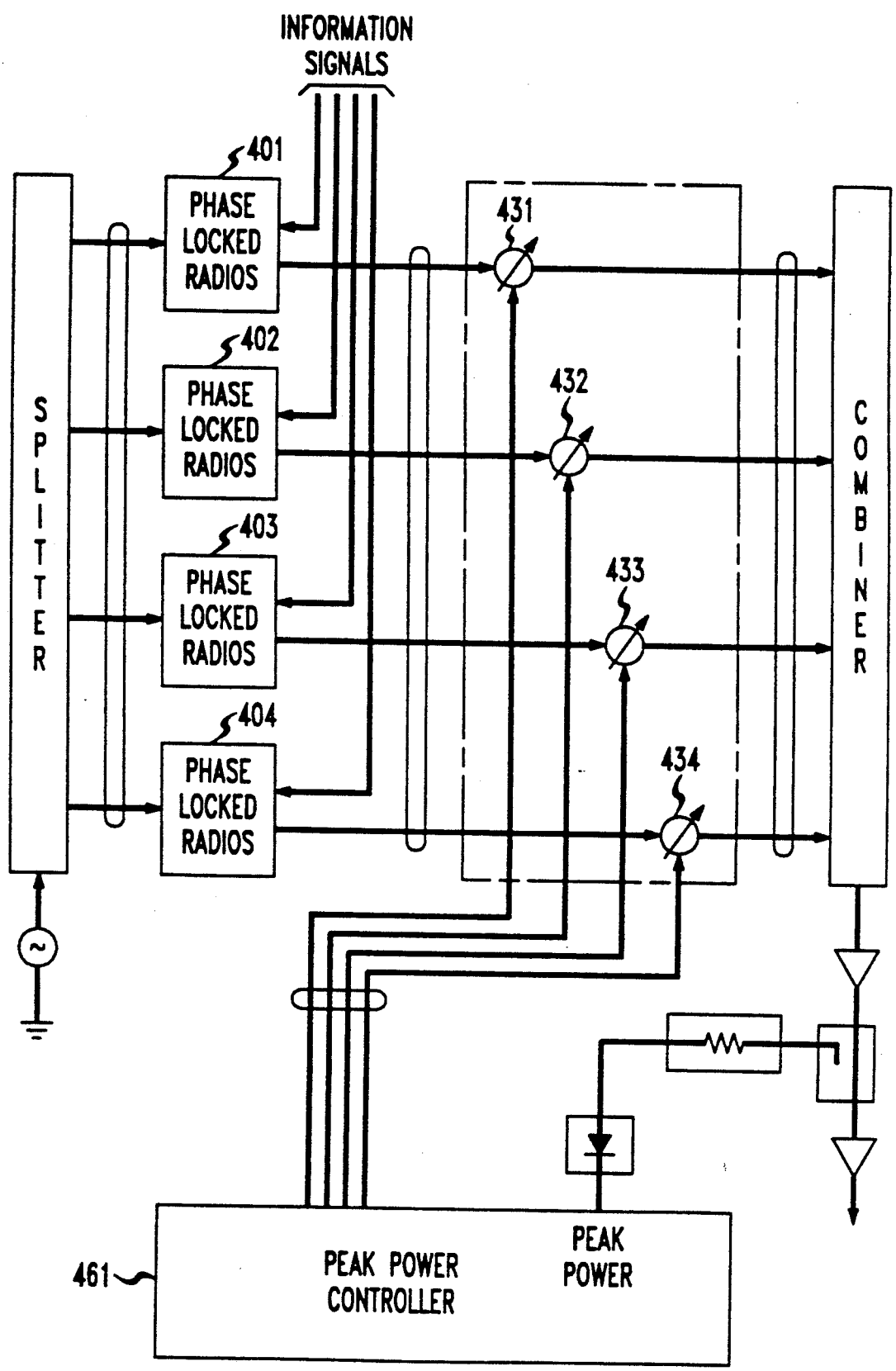
FIG. 4 is a block schematic of another amplifier system control arrangement to limit the peak power of an amplifier system.

An alternative arrangement for preventing high to peak-to-average power ratios from occurring is shown in the FIG. 4. The system components are identical to those described with reference to the FIG. 1 system, but their relative positioning is altered. The chief alteration is the positioning of the voltage controlled phase shifters 431-434 to phase shift the carrier at the outputs of the transceivers 401-404. This repositioning requires phase shifts in the order of 30 to 60 degrees to be effective. Otherwise the operation is substantially similar to the operation of the phase shift system of FIG. 1. The control circuit 461 used is identical to the control circuit 161 of FIG. 1 and disclosed in FIG. 2 except for the phase shift increment used.

We claim:

1. In an amplifier system in which a plurality of signals of differing frequency are combined for amplification, apparatus for minimizing a peak power envelope of the plurality of signals;
   a peak power detector connected for sensing the peak power envelope of the combined plurality of signals;
   a first comparator connected to compare the peak power output of the peak power detector with a reference power level;
   circuitry for adjusting a phase of at least one of the plurality of signals in response to the first comparator, including;
   a plurality of signal storage elements each associated with one of the plurality of signals and each being selectively responsive to an output of the first comparator, and
   a plurality of phase shifters each individually connected in a path of one of the plurality of signals and responsive to a signal storage element associated with that path of one of the plurality of signals.

2. An amplifier system as claimed in claim 1,
   further including circuitry for utilizing a previously sampled peak power level as a reference signal, and
   the first comparator output is indicative of amplitude migration direction of the peak power envelope.

3. An amplifier system as claimed in claim 2,
   further including a current source responsive to the amplitude migration direction for applying charge to the signal storage elements, and
   means for controlling the average current output of the current source.

4. An amplifier system as claimed in claim 3, further including limiting means for controlling a range of current output supplied by the current source.

5. An amplifier system as claimed in claim 4,
   further including a multiplex circuit for coupling the current source to selected signal storage elements.

6. An amplifier system as claimed in claim 5,
   wherein the means for controlling the average current output includes a second comparator connected for comparing a peak envelope power level with a generated undulating periodic waveform.

7. An amplifier system as claimed in claim 6, further including sequencing means for generating a sequence of pulses,
   switching apparatus for coupling the sequence of pulses in sequence to said plurality of phase shifters.

8. An amplifier system as claimed in claim 7,
   further including first and second storage capacitors connected to the inputs of the first comparator,
   the switching apparatus includes first and second switches for selectively connecting the peak power detector to the first and second storage capacitors, and
   the sequencing means is connected for controlling the first and second switches to conduct at different times.

9. An amplifier system as claimed in claim 7,
   further including means responsive to the sequencing means for inhibiting the operation of the multiplex circuit at least once in each cycle of operation.

10. An amplifier system as claimed in claim 6,
    further including a toggle flip flop connecting the first comparator to the current source.

* * * * *